US009755341B2

(12) United States Patent
Annis et al.

(10) Patent No.: US 9,755,341 B2
(45) Date of Patent: Sep. 5, 2017

(54) FLEXIBLE PRINTED CIRCUIT BOARD CONNECTOR

(71) Applicant: Tyco Electronics Corporation, Berwyn, PA (US)

(72) Inventors: Kyle Gary Annis, Hummelstown, PA (US); Dustin Carson Belack, Hummelstown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 167 days.

(21) Appl. No.: 14/736,866

(22) Filed: Jun. 11, 2015

(65) Prior Publication Data
US 2016/0365660 A1 Dec. 15, 2016

(51) Int. Cl.
H01R 12/79 (2011.01)
H05K 1/18 (2006.01)
H01R 12/78 (2011.01)
H05K 1/11 (2006.01)
H05K 1/14 (2006.01)
H05K 3/36 (2006.01)

(52) U.S. Cl.
CPC ............ H01R 12/79 (2013.01); H01R 12/78 (2013.01); H05K 1/189 (2013.01); H05K 1/118 (2013.01); H05K 1/147 (2013.01); H05K 3/365 (2013.01); H05K 2201/10189 (2013.01); H05K 2201/10363 (2013.01)

(58) Field of Classification Search
CPC .................. H05K 1/118; H05K 1/147; H05K 2201/10363; H05K 3/365; H05K 2201/10189; H05K 1/189

USPC .............. 439/65, 67, 88, 493, 495, 497, 66
See application file for complete search history.

(56) References Cited

U.S. PATENT DOCUMENTS

| 4,116,516 | A | | 9/1978 | Griffin | |
|---|---|---|---|---|---|
| 4,184,729 | A | * | 1/1980 | Parks | ..................... H01R 12/62 29/830 |
| 4,828,512 | A | | 5/1989 | McCormick et al. | |
| 5,667,401 | A | | 9/1997 | Kuwabara | |
| 5,742,484 | A | * | 4/1998 | Gillette | ................... H05K 1/148 174/106 R |

(Continued)

FOREIGN PATENT DOCUMENTS

| KR | 101 500 518 B1 | 3/2015 |
|---|---|---|
| WO | 2008 120513 A1 | 10/2008 |
| WO | 2013 141858 A1 | 9/2013 |

OTHER PUBLICATIONS

International Search Report, International Application No. PCT/US2016/035379, International Filng Date, Jun. 2, 2016.

Primary Examiner — Edwin A. Leon

(57) ABSTRACT

A flexible printed circuit board (FPCB) connector includes a housing having a first mating interface configured for mating with a first FPCB and a second mating interface configured for mating with a second FPCB. A plurality of jumper conductors are held by the housing. The jumper conductors have first mating ends at the first mating interface being configured for mating with the first FPCB and the jumper conductors having second mating ends at the second mating interface being configured for mating with the second FPCB. The first mating interface is configured to be mated to the first FPCB at any location along a length of the first FPCB including locations remote from an end of the first FPCB.

25 Claims, 6 Drawing Sheets

(56) References Cited

U.S. PATENT DOCUMENTS 6,930,240 B1    8/2005   Giboney et al.
2007/0184682 A1   8/2007   Gobron

* cited by examiner

FLEXIBLE PRINTED CIRCUIT BOARD CONNECTOR

BACKGROUND OF THE INVENTION

The subject matter herein relates generally to flexible printed circuit board connectors.

Flexible printed circuit boards, also known as flex circuits, are used in various electronic devices. The flexible printed circuit boards have electronic circuits on flexible plastic substrates allowing the board to conform to a desired shape, or to flex during its use. Flex circuits are often used in applications where flexibility, space savings, size, weight or power constraints, or production constraints limit the serviceability of rigid circuit boards. However, conventional flexible printed circuit boards have problems making electrical connections. For example, many flexible printed circuit boards require a rigid substrate at the end to make a reliable connection to another component. Additionally, typically, the traces are fanned out at the end in order to transition to a reliable, separable interface. Additionally, conventional flexible printed circuit boards are only terminated at the end of the flexible printed circuit board.

A need exists for a flexible printed circuit board connector that is cost effective and reliable and that may provide termination to the flexible printed circuit board at any location along the length of the flexible printed circuit boards.

BRIEF DESCRIPTION OF THE INVENTION

In one embodiment, a flexible printed circuit board (FPCB) connector is provided including a housing having a first mating interface configured for mating with a first FPCB and a second mating interface configured for mating with a second FPCB. A plurality of jumper conductors are held by the housing. The jumper conductors have first mating ends at the first mating interface being configured for mating with the first FPCB and the jumper conductors having second mating ends at the second mating interface being configured for mating with the second FPCB. The first mating interface is configured to be mated to the first FPCB at any location along a length of the first FPCB including locations remote from an end of the first FPCB.

In another embodiment, a flexible printed circuit board (FPCB) connector is provided including a housing holding a first interposer defining a first mating interface configured for mating with a first FPCB and holding a second interposer defining a second mating interface configured for mating with a second FPCB. A jumper circuit board is held by the housing between the first and second interposers. The FPCB connector includes a plurality of jumper conductors. The jumper conductors have first interposer conductors at the first mating interface being configured for mating with the first FPCB. The jumper conductors have second interposer conductors at the second mating interface being configured for mating with the second FPCB. The jumper conductors have jumper circuit board conductors between the first and second interposer conductors. The first mating interface is configured to be mated to the first FPCB at any location along a length of the first FPCB, including locations remote from an end of the first FPCB.

In a further embodiment, a flexible printed circuit board (FPCB) connector is provided including a housing having a first mating interface configured for mating with a first FPCB and a second mating interface configured for mating with a second FPCB. The housing includes a plurality of wafers stacked together. Each wafer includes a leadframe and an overmolded body overmolded over the leadframe. The overmolded bodies of the wafers define at least a portion of the housing. Each leadframe includes a plurality of jumper conductors held by the corresponding overmolded body. The jumper conductors have first mating ends at the first mating interface being configured for mating with the first FPCB and the jumper conductors having second mating ends at the second mating interface being configured for mating with the second FPCB. The first mating interface is configured to be mated to the first FPCB at any location along a length of the first FPCB, including locations remote from an end of the first FPCB.

DETAILED DESCRIPTION OF THE INVENTION

Figure 1:
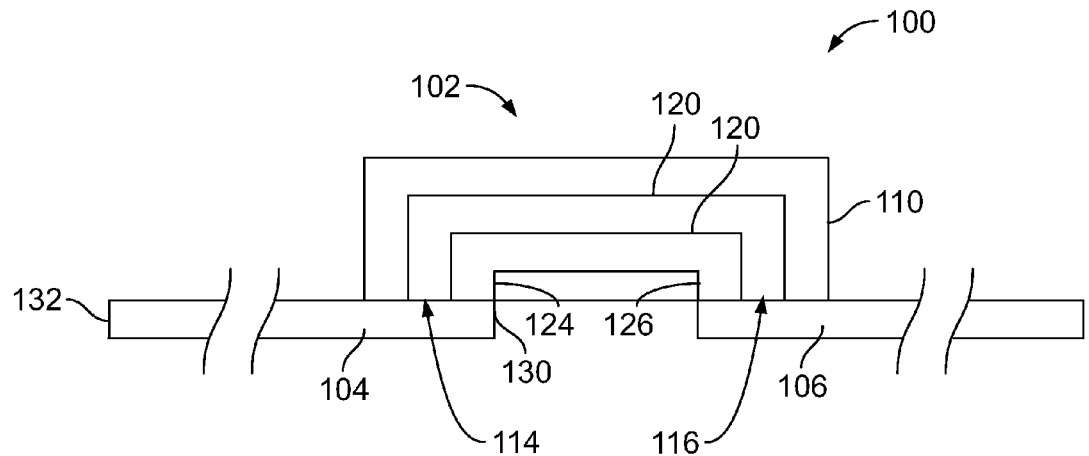
FIG. 1 is a schematic illustration of a connector system formed in accordance with an exemplary embodiment having a flexible printed circuit board (FPCB) connector coupled to one or more FPCBs.

FIG. 1 is a schematic illustration of a connector system 100 formed in accordance with an exemplary embodiment. The connector system 100 includes a flexible printed circuit board (FPCB) connector 102 configured to be electrically connected between a first FPCB 104 and a second component 106, which may be a second FPCB and may be referred to hereinafter as a second FPCB 106. However, in alternative embodiments, the second electrical component 106 may be a component other than a FPCB, such as a rigid circuit board, another electrical connector, or another electronic device.

The FPCB connector 102 includes a housing 110 having a first mating interface 114 configured for mating with the first FPCB 104 and a second mating interface 116 configured for mating with the second FPCB 106. The FPCB connector 102 includes a plurality of jumper conductors 120 held by the housing 110. The jumper conductors 120 have first mating ends 124 at the first mating interface 114 configured for mating with the first FPCB 104 and the jumper conductors 120 have second mating ends 126 at the second mating interface 116 configured for mating with the second FPCB 106.

In an exemplary embodiment, the first mating interface 114 is configured to be mated to the first FPCB 104 at any location along a length of the first FPCB 104, including locations remote from ends 130, 132 of the first FPCB 104. For example, the FPCB connector 102 may be used as a takeoff connector to take off signal and/or power transmissions from a midpoint of the FPCB 104. The FPCB connector 102 may be used at a breakpoint to accommodate various wiring or routing architectures for the connector system 100. The mating interface 114 may be configured to be selectively mated to the FPCB 104 at regular intervals along the FPCB 104. In other various embodiments, the first mating interface 114 may be mated to the first FPCB 104 at one of the ends 130 or 132. Similarly, the FPCB connector 102 may be mated to the second FPCB 106 either at an end thereof, or alternatively, remote from the ends of the second FPCB 106. For example, the FPCB connector 102 may be mated at a midpoint of the second FPCB 106 such that the second FPCB 106 continues under or over the first FPCB 104. The FPCBs 104, 106 may be transverse to each other or may be parallel to each other in some various embodiments.

In an exemplary embodiment, the FPCB connector 102 may be a high-speed and high density electrical connector used to connect to high-speed and high density FPCBs 104, 106. The FPCB connector 102 may be used in long connection runs in various embodiments. The FPCB connector 102 may be used as part of a computer system or a communication system, such as a backplane system. The FPCB connector 102 may be used to splice the FPCBs 104, 106 together. In an exemplary embodiment, the connector system 100 is part of a flexible communication system where various components may be interconnected by FPCBs. The FPCBs 104, 106 allow flexibility in the design and system layout. The FPCB connector 102 establishes communication between the various components and FPCBs 104, 106. The connector system 100 may be designed to meet different requirements for different purposes such as transmission of high speed signals, low speed signals, power, and the like between the various components. Because space may be limited within the system, the FPCBs allow electrical connection without the need for a rigid circuit board architecture or a cable architecture. For example, midplane boards, daughtercards and/or backplanes and the cabling therebetween may be eliminated in the communication system 100 with the use of the FPCBs. The FPCB connector 102 offers flexibility and customization within the connector system 100 by using modular components which can be used in a variety of combinations. The connector system 100 provides a flexible platform to provide the density, data throughput, and signal integrity required for various applications in computer, communications, military, medical, industrial control or other industries.

In an exemplary embodiment, the FPCB connector 102 includes connector halves configured to interface with both sides of the FPCBs 104, 106. The connector halves may be coupled together and are oriented on opposite sides of the FPCBs 104, 106. In an exemplary embodiment, the FPCBs 104, 106 are multilayer FPCBs having one or more signal layers and/or one or more power layers. The FPCBs 104, 106 may have ground layers interspersed with the signal and/or power layers. In an exemplary embodiment, the FPCBs 104, 106 have plated vias that extend through the various layers to bring the signal and/or power transmissions to one or both surfaces of the FPCBs 104, 106. Optionally, pads may be provided at such surface for interfacing with the FPCB connector 102. Alternatively, the vias may be open and configured to receive solder tails or other types of electrical connections from the FPCB connector 102.

Figure 2:
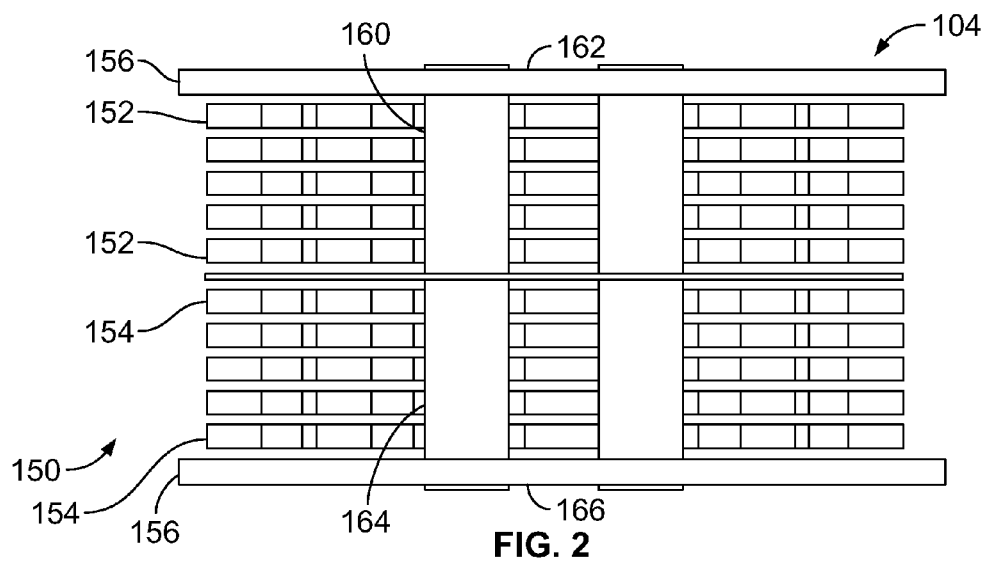
FIG. 2 illustrates an exemplary FPCB formed in accordance with an exemplary embodiment.
Figure 3:
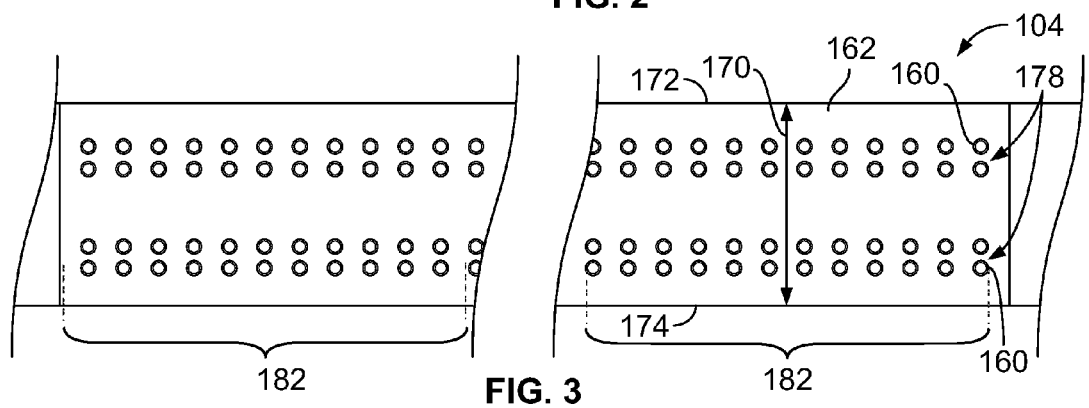
FIG. 3 is a top view of the FPCB shown in FIG. 2.
Figure 4:
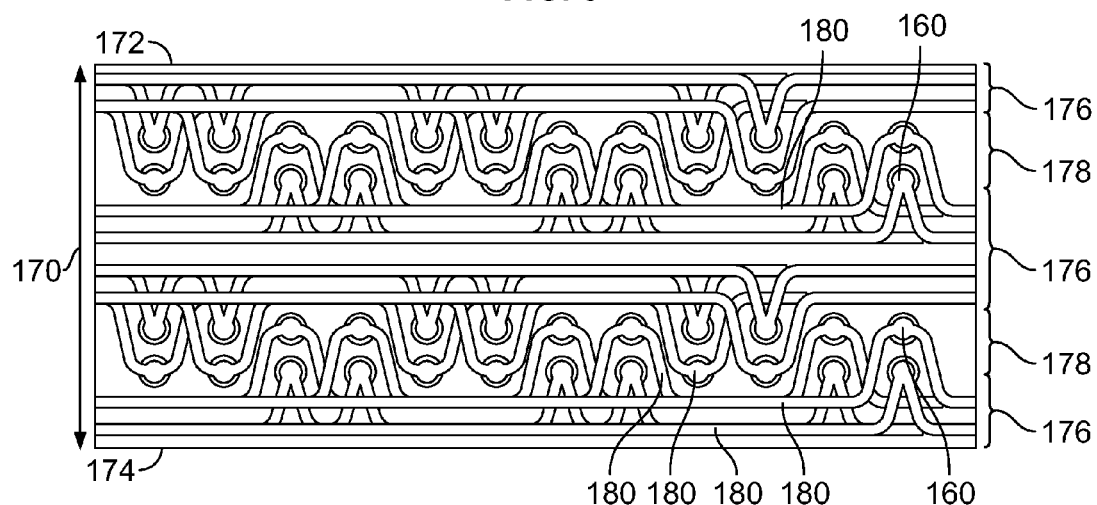
FIG. 4 is a top view of an internal signal layer of the FPCB shown in FIG. 2.

FIG. 2 illustrates an exemplary FPCB 104 formed in accordance with an exemplary embodiment. FIG. 3 is a top view of the FPCB 104. FIG. 4 is a top view of an internal signal layer of the FPCB 104. The FPCB 104 includes a plurality of layers 150, including signal layers 152, power layers 154, and ground layers 156. The layers 150 may be provided in any arrangement. Optionally, insulating layers may be provided between the other various layers. In the illustrated embodiment, the signal layers 152 defined the top layers while the power layers 154 defined the bottom layers and with the ground layers 156 as the outer layers at the top and bottom of the FPCB 104.

Signal vias 160 extend through the signal layers 152 to a top 162. Similarly, power vias 164 extend through the power layers 154 to a bottom 166. The FPCB 104 has a width 170 between opposite edges 172, 174. In an exemplary embodiment, the FPCB 104 is divided widthwise into circuit tracks 176 and via tracks 178. The vias 160 are arranged in the via tracks 178. In the illustrated embodiment, the vias 160 are arranged in pairs, which may be differential pairs. Conductors 180 of the FPCB 104, such as signal traces, power traces and the like are routed lengthwise along the FPCB 104 within the circuit tracks 176. In a mating zone 182 of the FPCB 104, the traces are routed out of the circuit tracks 176 to the corresponding vias 160. Optionally, the conductors 180, within the signal layers 152, are arranged in pairs; however, other arrangements are possible in alternative embodiments. The conductors 180 on different signal layers 152 are routed to different vias 160. In the illustrated embodiment, the FPCB 104 includes outer circuit tracks 176 and inner circuit tracks 176 with the via tracks 178 arranged between the inner and outer circuit tracks 176. Other arrangements are possible in alternative embodiments. The FPCB 104 may have any number of circuit tracks 176 and any number of via tracks 178.

Figure 5:
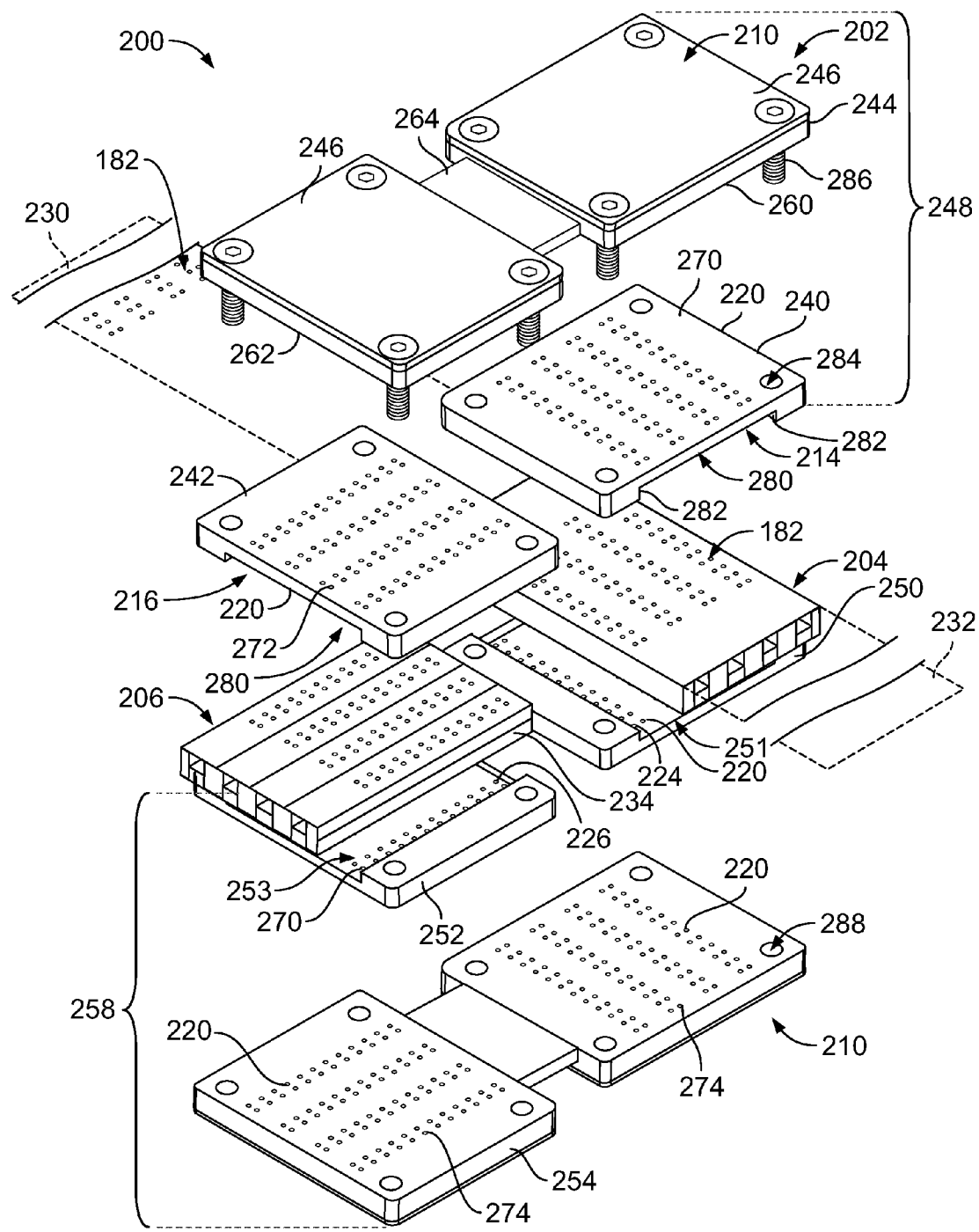
FIG. 5 is an exploded view of a FPCB connector in accordance with an exemplary embodiment.

FIG. 5 is an exploded view of a FPCB connector 202 in accordance with an exemplary embodiment. The FPCB connector 202 is configured to be electrically connected between a first FPCB 204 and a second component 206, which may be a second FPCB and may be referred to hereinafter as a second FPCB 206. However, in alternative embodiments, the second electrical component 206 may be a component other than a FPCB, such as a rigid circuit board, another electrical connector, or another electronic device.

The FPCB connector 202 includes a housing 210 having a first mating interface 214 configured for mating with the first FPCB 204 and a second mating interface 216 configured for mating with the second FPCB 206. The FPCB connector 202 includes a plurality of jumper conductors 220 held by the housing 210. The jumper conductors 220 have first mating ends 224 at the first mating interface 214 configured for mating with the first FPCB 204 and the jumper conductors 220 have second mating ends 226 at the second mating interface 216 configured for mating with the second FPCB 206.

In an exemplary embodiment, the first mating interface 214 is configured to be mated to the first FPCB 204 at any location along a length of the first FPCB 204, including locations remote from ends 230, 232 of the first FPCB 204. For example, the FPCB connector 202 may be used as a takeoff connector to take off signal and/or power transmissions from a midpoint of the FPCB 204. The FPCB connector 202 may be used at a breakpoint to accommodate various wiring or routing architectures for the connector system 200. In other various embodiments, the first mating interface 214 may be mated to the first FPCB 204 at one of the ends 230 or 232. Similarly, the FPCB connector 202 may be mated to the second FPCB 206 either at an end 234 thereof, or alternatively, remote from the ends 234 of the second FPCB 206.

In an exemplary embodiment, the FPCB connector 202 includes a first interposer 240 defining the first mating interface 214 and a second interposer 242 defining the second mating interface 216. The first and second interposers 240, 242 may be held by the housing 210. Optionally, the interposers 240, 242 may define portions of the housing 210. In an exemplary embodiment, the FPCB connector 202 includes a jumper circuit board 244 held by the housing 210 between the first and second interposers 240, 242. In the illustrated embodiment, the housing 210 includes one or more backer plates 246 that are used to hold the various components of the FPCB connector 202. The housing 210 may include other components in addition to the backer plates 246 to house or hold the various components of the FPCB connector 202. Other types of housings may be used in alternative embodiments.

The interposers 240, 242 and the jumper circuit board 244 form an upper connector assembly 248 of the FPCB connector 202. The upper connector assembly 248 is configured to be mated to upper or top surfaces of the FPCBs 204, 206. In an exemplary embodiment, the FPCB connector 202 includes a lower connector assembly 258 configured to be mated to the lower or bottom surfaces of the FPCBs 204, 206. As such, the FPCB connector 202 is configured to be mated to conductors of the FPCBs 204, 206 along both sides of the FPCBs 204, 206. The lower connector assembly 258 may be similar or identical to the upper connector assembly 248, and thus will not be described in detail. Components of the lower connector assembly 258 may be identified with similar reference numbers as the upper connector assembly 248. In an exemplary embodiment, the lower connector assembly 258 includes a third interposer 250 defining a third mating interface 251 and a fourth interposer 252 defining a fourth mating interface 253. The lower connector assembly 258 includes a jumper circuit board 254 extending between and electrically connected to the third and fourth interposers 250, 252.

The jumper circuit board 244 includes a first rigid end circuit board 260, a second rigid end circuit board 262 and an intermediate flexible circuit board 264 between the first and second rigid end circuit boards 260, 262. The intermediate flexible circuit board 264 allows the first and second rigid end circuit boards 260, 262 to be variably positionable for mating with the first and second interposers 240, 242 and with the first and second FPCBs 204, 206. The first and second rigid end circuit boards 260, 262 may be supported or held by corresponding backer plates 246. Optionally, the end circuit boards 260, 262 and intermediate circuit board 264 may be manufactured during a common manufacturing process. For example, the substrate or dielectric material used to form the substrate layers of the circuit boards 260, 262, 264 may be different for the rigid circuit boards 260, 262 than the flexible circuit board 264. However, the circuits may be common to each of the substrate layers across the circuit boards 260, 262, 264. The jumper circuit board 244 may have other arrangements in alternative embodiments. For example, the jumper circuit board 244 may be a single rigid circuit board extending between the opposite ends of the jumper circuit board 244. Alternatively, the jumper circuit board 244 may be a single flex circuit extending between the opposite ends of the jumper circuit board 244.

The jumper conductors 220 provide electrical pathways between the first and second FPCBs 204, 206. In the illustrated embodiment, each of the jumper conductors 220 include multiple, discrete segments electrically connected at various interfaces. For example, the jumper conductors 220 have first interposer conductors 270 at the first interposer 240 being configured for mating with the first FPCB 204, the jumper conductors 220 have second interposer conductors 272 at the second interposer 242 being configured for mating with the second FPCB 206, and the jumper conductors 220 have jumper circuit board conductors 274 between the first and second interposer conductors 270, 272.

The first interposer 240 holds the first interposer conductors 270. For example, the first interposer conductors 270 may include spring beams, plated vias, pads, colder balls, conductive elastomeric columns, metallized particle interconnects, compressive contacts, pin contacts, and the like. Optionally, the first interposer conductors 270 may be a land grid array, a ball grid array, a pin grid array, and the like. The first interposer conductors 270 may define a separable interface with the FPCB 204 and/or with the jumper circuit board conductors 274. Alternatively, the first interposer conductors 270 may define a permanent interface with the FPCB 204 and/or with the jumper circuit board conductors 274, such as by soldering thereto. In other various embodiments, the FPCB connector 202 may be provided without the interposer 240 and corresponding interposer conductors 270. Rather, the jumper circuit board 244 may be coupled directly to the FPCB 204.

The second interposer 242 holds the second interposer conductors 272. For example, the second interposer conductors 272 may include spring beams, plated vias, pads, colder balls, conductive elastomeric columns, metallized particle interconnects, compressive contacts, pin contacts, and the like. Optionally, the second interposer conductors 272 may be a land grid array, a ball grid array, a pin grid array, and the like. The second interposer conductors 272 may define a separable interface with the FPCB 206 and/or with the jumper circuit board conductors 274. Alternatively, the second interposer conductors 272 may define a permanent interface with the FPCB 206 and/or with the jumper circuit board conductors 274, such as by soldering thereto. In other various embodiments, the FPCB connector 202 may be provided without the interposer 242 and corresponding interposer conductors 272. Rather, the jumper circuit board 244 may be coupled directly to the FPCB 206.

The jumper circuit board conductors 274 are defined by circuits or conductors of the circuit boards 260, 262, 264. For example, the jumper circuit board conductors 274 may be traces, vias or other components of the circuit boards 260, 262, 264. The jumper circuit board conductors 274 may include pads along the end circuit boards 260, 262 defining an interface for the interposer conductors 270, 272. Optionally, the jumper circuit board conductors 274 may be soldered to the interposer conductors 270, 272. Alternatively, the jumper circuit board conductors 274 and/or the interposer conductors 270, 272 may include spring beams or other types of contacts to define a separable interface therebetween.

In an exemplary embodiment, the interposers 240, 242 include flex channels 280 that receive corresponding FPCBs 204 or 206. The first mating interface 214 and the third mating interface 251 are arranged on opposite sides of the corresponding flex channel 280 and the second mating interface 216 and the fourth mating interface 253 are arranged on opposite sides of the corresponding flex channel 280.

The interposers 240, 242 include alignment features 282, such as walls or shoulders defining the flex channels 280 that align the FPCBs 204, 206 in the flex channels 280. The alignment features 282 may extend through at least a portion of the FPCBs 204, 206 to locate the FPCBs 204, 206 relative to the interposers 240, 242. For example, the alignment features 282 may be posts extending through one or more layers of the FPCBs 204, 206. The interposers 240, 242 include openings 284 therethrough. The openings 284 are configured to receive fasteners 286 therethrough. The circuit boards 260, 262 may include similar openings 288 also receiving the fasteners 286. The fasteners 286 may secure the backer plates 246 of the upper connector assembly 248 to the backer plates of the lower connector assembly 258. Optionally, the fasteners 286 may be threaded fasteners. Other types of securing features may be used in alternative embodiments to hold the various components of the FPCB connector 202 together. Optionally, the housing 210 may include other components to at least partially surround the upper and lower connector assemblies 248, 258, such as upper and lower shells that completely surround or encase the upper and lower connector assemblies 248, 258.

Figure 6:
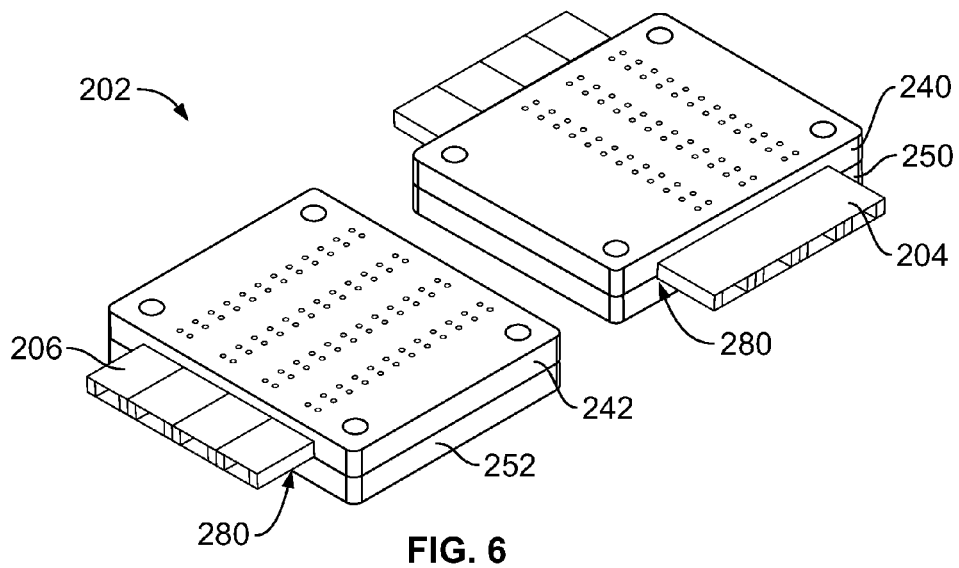
FIG. 6 is a top perspective view of a portion of the FPCB connector shown in FIG. 5.

FIG. 6 is a top perspective view of a portion of the FPCB connector 202 during assembly. During assembly, the interposers 240, 242 are assembled to the top sides of the FPCBs 204, 206 and the interposers 250, 252 are assembled to the bottom sides of the FPCBs 204, 206. The FPCBs 204, 206 extends through corresponding flex channels 280 of the interposers 240, 242, 250, 252. In the illustrated embodiment, the FPCBs 204, 206 are oriented perpendicular to each other (e.g., the traces of the FPCBs 204, 206 are oriented perpendicular to each other). The second FPCB 206 extends from the side of the first FPCB 204 and is thus oriented at a right angle or perpendicular with respect to the first FPCB 204. Alternatively, the FPCBs 204, 206 may be oriented parallel to each other or at other angular orientations. Optionally, the FPCBs may be vertically stacked, such as with a portion or length of one of the FPCBs 204 being above a portion or length of the other FPCB 206. The first and third interposers 240, 250 are oriented perpendicular with respect to the second and fourth interposers 242, 252. The orientations of the interposers correspond to the orientations of the FPCBs 204, 206.

Figure 7:
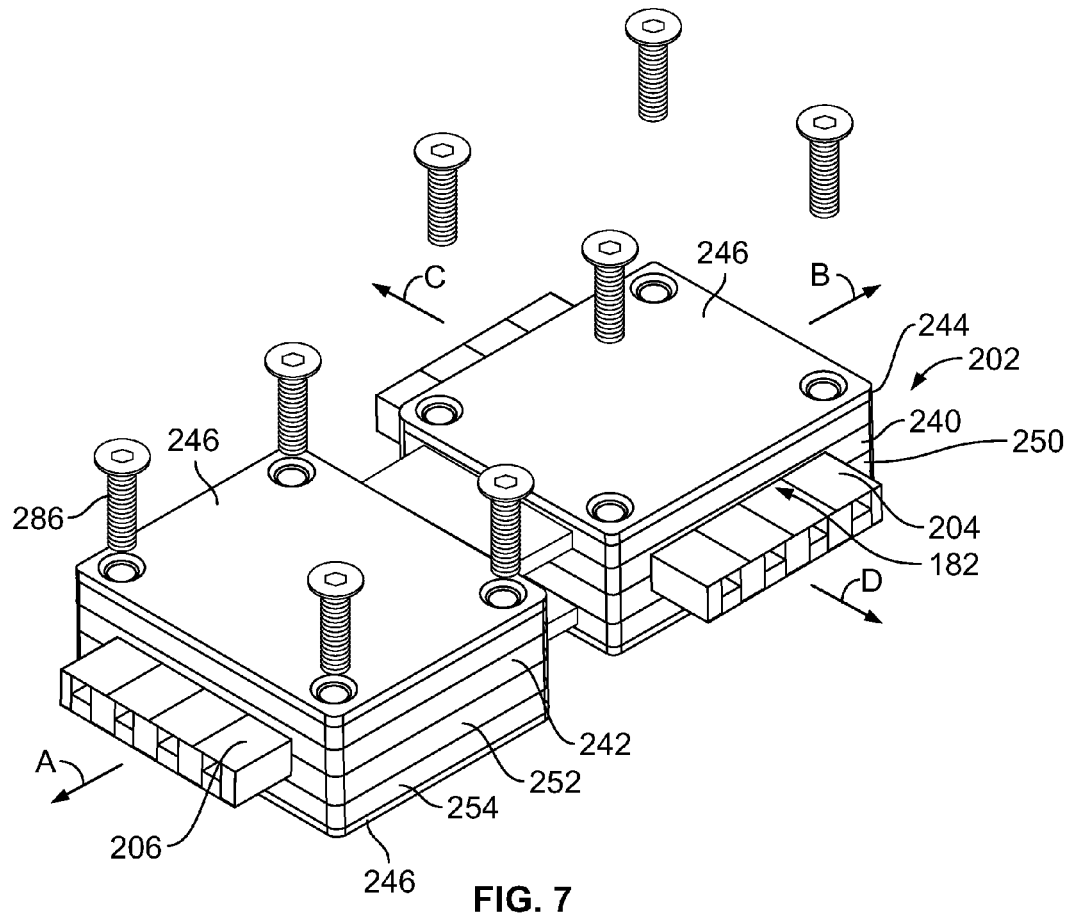
FIG. 7 is a top perspective view of the FPCB connector shown in FIG. 5.

FIG. 7 is a top perspective view of the FPCB connector 202 during assembly. During assembly, the jumper circuit boards 244, 254 are coupled to the corresponding interposers 240, 242 and 250, 252, respectively. The jumper circuit board 244 electrically connects the first and second interposers 240, 242. The jumper circuit board 254 electrically connects the third and fourth interposers 250, 252. The fasteners 286 secure the backer plates 246 together to hold the FPCB connector 202 together. Optionally, the FPCB 204 may include multiple mating zones 182 along the length thereof. The FPCB connector 202 may be coupled at any of the various mating zones 182 to take off some or all of the signal and/or power transmissions at such location. Optionally, multiple FPCB connectors 202 may be coupled to the first FPCB 204 at various locations. While the FPCB connector 202 is shown terminated to the end of the second FPCB 206, it is possible that the FPCB connector 202 may be mated to the second FPCB 206 at any location along a length of the second FPCB 206, including locations remote from the end of the FPCB 206. For example, the FPCB 206 may extend from the FPCB connector 202 in the direction of arrow A and in the direction of arrow B, while the FPCB 204 may extend from the FPCB connector 202 in the direction of arrow C and in the direction of arrow D.

Figure 10:
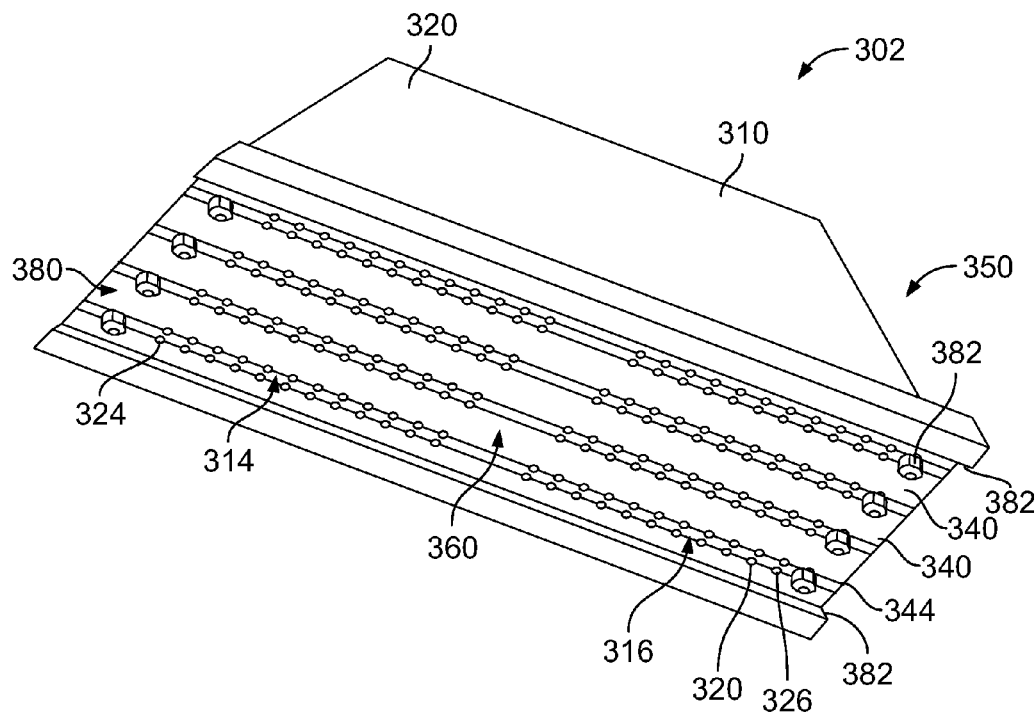
FIG. 10 is a bottom perspective view of a portion of the FPCB connector shown in FIG. 8.
Figure 8:
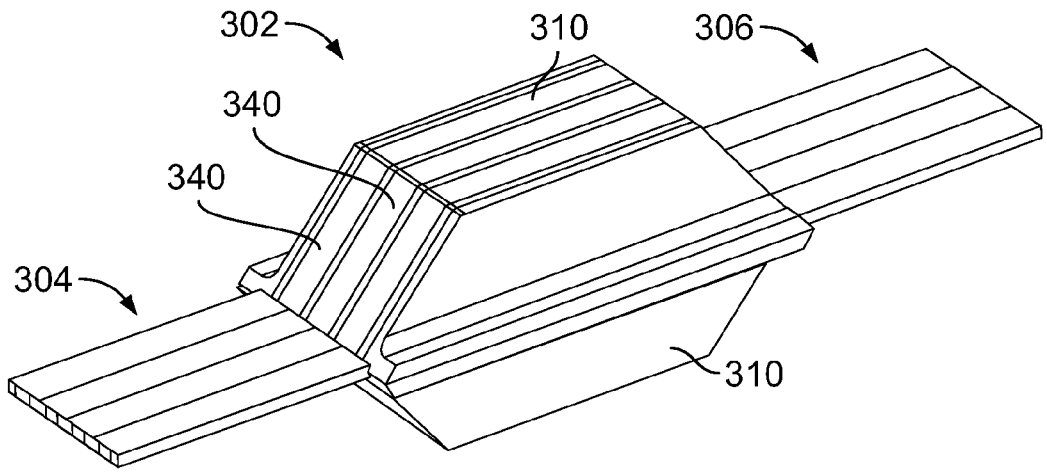
FIG. 8 illustrates a FPCB connector in accordance with an exemplary embodiment.
Figure 9:
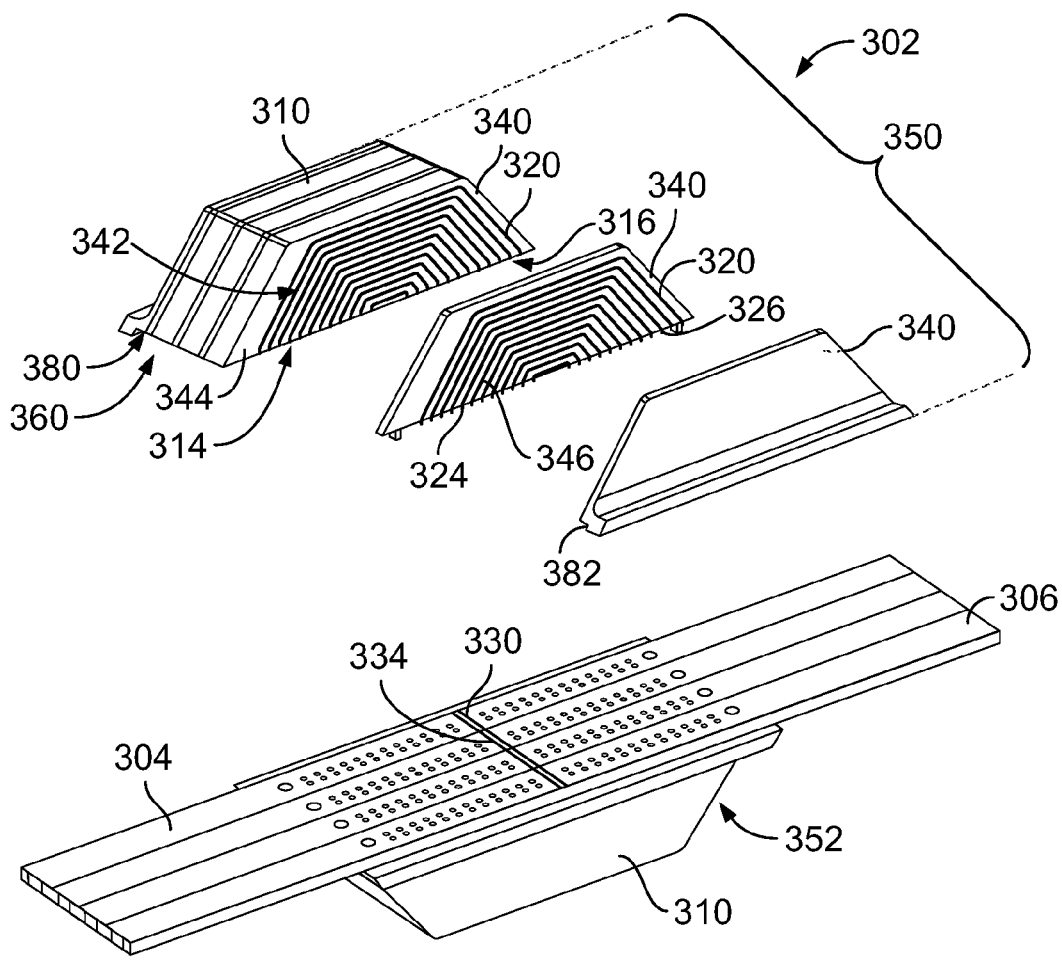
FIG. 9 is an exploded view of the FPCB connector shown in FIG. 8.

FIG. 8 illustrates a FPCB connector 302 in accordance with an exemplary embodiment showing the FPCB connector 302 connected to first and second FPCBs 304, 306 (although the second component 306 may be any type of electrical component and is not limited to a FPCB). FIG. 9 is an exploded view of the FPCB connector 302. FIG. 10 is a bottom perspective view of a portion of the FPCB connector 302.

The FPCB connector 302 includes a housing 310 having a first mating interface 314 configured for mating with the first FPCB 304 and a second mating interface 316 configured for mating with the second FPCB 306. The FPCB connector 302 includes a plurality of jumper conductors 320 held by the housing 310. The jumper conductors 320 have first mating ends 324 at the first mating interface 314 configured for mating with the first FPCB 304 and the jumper conductors 320 have second mating ends 326 at the second mating interface 316 configured for mating with the second FPCB 306.

In an exemplary embodiment, the first mating interface 314 is configured to be mated to the first FPCB 304 at an end 330 of the first FPCB 304 and the FPCB connector 302 is configured to be mated to the second FPCB 306 at an end 334 thereof. The FPCB connector 302 thus defines an end-to-end connection for the FPCBs 304, 306.

In an exemplary embodiment, the FPCB connector 302 includes a plurality of wafers 340 stacked together. Each wafer 340 includes a leadframe 342 (shown in FIG. 9) and an overmolded body 344 overmolded over the leadframe 342. The leadframe 342 may be a stamped and formed leadframe to form the first and second mating ends 324, 326 as well as intermediate segments 346 between the first and second mating ends 324, 326. The leadframe 342 defines a plurality of the jumper connectors 320. The overmolded body 344 is manufactured from a dielectric material, such as a plastic material. The overmolded body 344 may be injection molded into a mold around the leadframe 342 to hold the jumper conductors 320. Optionally, the intermediate segments 346 may be encased in the corresponding overmolded body 344. Alternatively, one side of the intermediate segments 346 may be exposed at a side of the overmolded body 344. The overmolded bodies 344 of the wafers 340 define at least a portion of the housing 310.

The wafers 340 are stacked and held together to form an upper connector assembly 350 of the FPCB connector 302. The upper connector assembly 350 is configured to be mated to upper or top surfaces of the FPCBs 304, 306. In an exemplary embodiment, the FPCB connector 302 includes a lower connector assembly 352 configured to be mated to the lower or bottom surfaces of the FPCBs 304, 306. As such, the FPCB connector 302 is configured to be mated to conductors of the FPCBs 304, 306 along both sides of the FPCBs 304, 306. The lower connector assembly 352 may be similar or identical to the upper connector assembly 350, and thus will not be described in detail. Components of the lower connector assembly 352 may be identified with similar reference numbers as the upper connector assembly 350. In an exemplary embodiment, the lower connector assembly 352 includes a plurality of wafers 340 each having an overmolded leadframe that defines the jumper conductors 320 of the lower connector assembly 352. The wafers 340 of the lower connector assembly 352 define a housing of the lower connector assembly 352, such lower connector assembly defining third and fourth mating interfaces configured for mating with the first and second FPCBs 304, 306.

The jumper conductors 320 provide electrical pathways between the first and second FPCBs 304, 306. In the illustrated embodiment, each of the jumper conductors 320 includes a single conductor extending between the first and second mating interfaces 314, 316. The jumper conductors 320 are arranged at different radial levels within the corresponding overmolded body 344. Optionally, the mating ends 324, 326 may extend from a mounting surface 360 of the wafer 340. The mounting surfaces 360 of the wafers 340 of the upper and lower connector assemblies 350, 352 are configured to be mounted to the first and second FPCBs 304, 306. The mating ends 324, 326 are exposed at the mounting surface 360 for mating to corresponding conductors of the first and second FPCBs 304, 306.

The jumper conductors 320 may include spring beams, compliant contacts, or other types of contacts. The first and second mating ends 324, 326 are arranged in an array for mating with corresponding conductors of the first and second FPCBs 304, 306. The mating ends 324, 326 may define a separable interface with the FPCB 304 and/or with the FPCB 306. Alternatively, the mating ends 324, 326 may define a permanent interface with the FPCB 304 and/or with the FPCB 306, such as by soldering thereto.

In an exemplary embodiment, the wafers 340 define a flex channel 380 that receive corresponding FPCBs 304 or 306. The wafers 340 may include alignment features 382, such as walls or shoulders defining the flex channel 380 that align the FPCBs 304, 306 in the flex channel 380. The alignment features 382 may extend through at least a portion of the FPCBs 304, 306 to locate the FPCBs 304, 306 relative to the wafers 340. For example, the alignment features 382 may be posts extending through one or more layers of the FPCBs 304, 306. Other types of securing features may be used in alternative embodiments to hold the various components of the FPCB connector 302 together.

Figure 11:
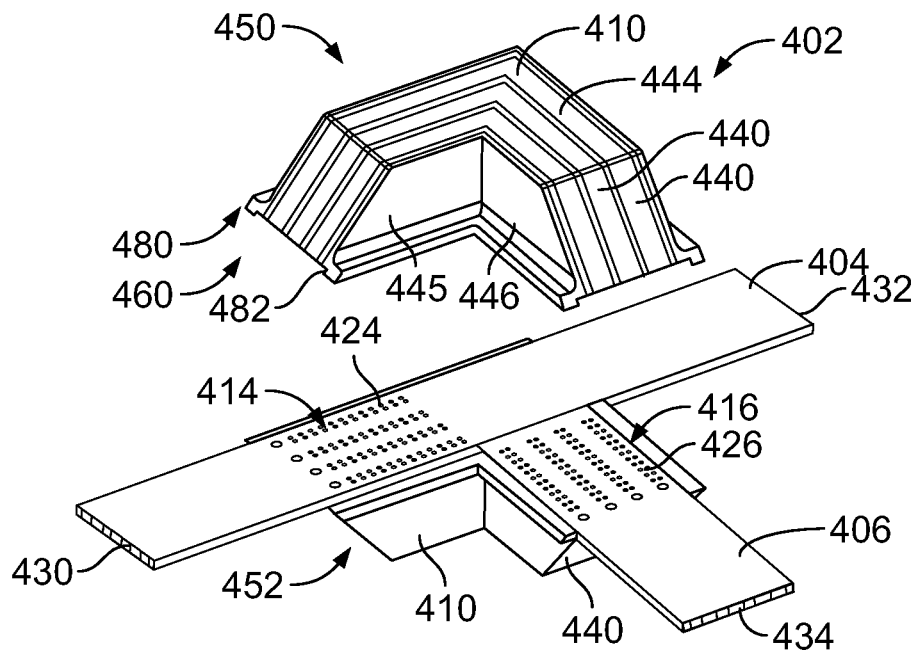
FIG. 11 illustrates a FPCB connector in accordance with an exemplary embodiment.
Figure 12:
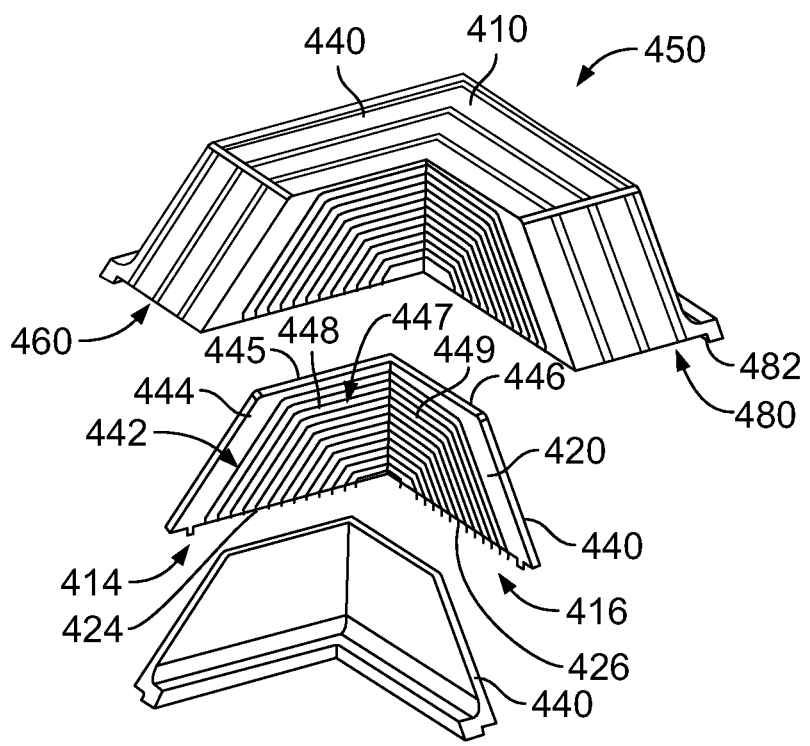
FIG. 12 is an exploded view of a portion of the FPCB connector shown in FIG. 11.

FIG. 11 illustrates a FPCB connector 402 in accordance with an exemplary embodiment showing the FPCB connector 402 connected to first and second FPCBs 404, 406 (although the second component 406 may be any type of electrical component and is not limited to a FPCB). FIG. 12 is an exploded view of a portion of the FPCB connector 402.

The FPCB connector 402 includes a housing 410 having a first mating interface 414 configured for mating with the first FPCB 404 and a second mating interface 416 configured for mating with the second FPCB 406. The FPCB connector 402 includes a plurality of jumper conductors 420 held by the housing 410. The jumper conductors 420 have first mating ends 424 at the first mating interface 414 configured for mating with the first FPCB 404 and the jumper conductors 420 have second mating ends 426 at the second mating interface 416 configured for mating with the second FPCB 406.

In an exemplary embodiment, the first mating interface 414 is configured to be mated to the first FPCB 404 at any location along a length of the first FPCB 404, including locations remote from ends 430, 432 of the first FPCB 404. For example, the FPCB connector 402 may be used as a takeoff connector to take off signal and/or power transmissions from a midpoint of the FPCB 404. The traces or conductors of the FPCB 404 may extend past the takeoff location such that the signal or power continues along the length when no FPCB connector 402 is coupled at such location. The FPCB connector 402 may be used at a breakpoint to accommodate various wiring or routing architectures for the connector system. In other various embodiments, the first mating interface 414 may be mated to the first FPCB 404 at one of the ends 430 or 432. Similarly, the FPCB connector 402 may be mated to the second FPCB 406 either at an end 434 thereof, or alternatively, remote from the ends 434 of the second FPCB 406. In the illustrated embodiment, the second FPCB 406 extends perpendicular with respect to the first FPCB 404. The FPCB connector 402 is configured to be mated to both the first and second FPCBs 404, 406 and thus defines a right angle connector.

In an exemplary embodiment, the FPCB connector 402 includes a plurality of wafers 440 stacked together. Each wafer 440 includes a leadframe 442 (shown in FIG. 9) and an overmolded body 444 overmolded over the leadframe 442. The leadframe 442 may be a stamped and formed leadframe to form the first and second mating ends 424, 426 as well as intermediate segments 447 between the first and second mating ends 424, 426. In the illustrated embodiment, the intermediate segments 447 are bent perpendicular having a first intermediate segment 448 and a second intermediate segment 449 oriented perpendicular with respect to the first intermediate segment 448. The leadframe 442 defines a plurality of the jumper connectors 420.

The overmolded body 444 is manufactured from a dielectric material, such as a plastic material. The overmolded body 444 may be injection molded into a mold around the leadframe 442 to hold the jumper conductors 420. Optionally, the intermediate segments 447 may be encased in the corresponding overmolded body 444. Alternatively, one side of the intermediate segments 447 may be exposed at a side of the overmolded body 444. The overmolded bodies 444 of the wafers 440 define at least a portion of the housing 410. In the illustrated embodiment, the wafers 440 are right angle wafers, wherein the overmolded bodies 444 include a first segment 445 and a second segment 446 oriented perpendicular with respect to the first segment 445. The wafers 440 are nested within each other to form the right angle connector.

The wafers 440 are stacked and held together to form an upper connector assembly 450 of the FPCB connector 402. The upper connector assembly 450 is configured to be mated to upper or top surfaces of the FPCBs 404, 406. In an exemplary embodiment, the FPCB connector 402 includes a lower connector assembly 452 configured to be mated to the lower or bottom surfaces of the FPCBs 404, 406. As such, the FPCB connector 402 is configured to be mated to conductors of the FPCBs 404, 406 along both sides of the FPCBs 404, 406. The lower connector assembly 452 may be similar or identical to the upper connector assembly 450, and thus will not be described in detail. Components of the lower connector assembly 452 may be identified with similar reference numbers as the upper connector assembly 450. In an exemplary embodiment, the lower connector assembly 452 includes a plurality of right angle wafers 440 each having an overmolded leadframe that defines the jumper conductors 420 of the lower connector assembly 452. The wafers 440 of the lower connector assembly 452 define a housing of the lower connector assembly 452, such lower connector assembly defining third and fourth mating interfaces configured for mating with the first and second FPCBs 404, 406.

The jumper conductors 420 provide electrical pathways between the first and second FPCBs 404, 406. In the illustrated embodiment, each of the jumper conductors 420 includes a single conductor extending between the first and second mating interfaces 414, 416. The jumper conductors 420 are arranged at different radial levels within the corresponding overmolded body 444. Optionally, the mating ends 424, 426 may extend from a mounting surface 460 of the wafer 440. The mounting surfaces 460 of the wafers 440 of the upper and lower connector assemblies 450, 452 are configured to be mounted to the first and second FPCBs 404,

406. The mating ends 424, 426 are exposed at the mounting surface 460 for mating to corresponding conductors of the first and second FPCBs 404, 406.

The jumper conductors 420 may include spring beams, compliant contacts, or other types of contacts. The first and second mating ends 424, 426 are arranged in an array for mating with corresponding conductors of the first and second FPCBs 404, 406. The mating ends 424, 426 may define a separable interface with the FPCB 404 and/or with the FPCB 406. Alternatively, the mating ends 424, 426 may define a permanent interface with the FPCB 404 and/or with the FPCB 406, such as by soldering thereto.

In an exemplary embodiment, the wafers 440 define a flex channel 480 that receive corresponding FPCBs 404 or 406. The wafers 440 may include alignment features 482, such as walls or shoulders defining the flex channel 480 that align the FPCBs 404, 406 in the flex channel 480. The alignment features 482 may extend through at least a portion of the FPCBs 404, 406 to locate the FPCBs 404, 406 relative to the wafers 440. For example, the alignment features 482 may be posts extending through one or more layers of the FPCBs 404, 406. Other types of securing features may be used in alternative embodiments to hold the various components of the FPCB connector 402 together.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A flexible printed circuit board (FPCB) connector comprising:
   a housing having a first mating interface configured for mating with a first FPCB and a second mating interface configured for mating with a second FPCB;
   a plurality of jumper conductors held by the housing, the jumper conductors having first mating ends at the first mating interface being configured for mating with the first FPCB and the jumper conductors having second mating ends at the second mating interface being configured for mating with the second FPCB;
   wherein the first mating interface is configured to be mated to the first FPCB at any location along a length of the first FPCB; and
   wherein the housing and the jumper conductors are oriented to define a right angle connection between the first and second FPCBs, wherein the traces of the first FPCB are oriented perpendicular to the traces of the second FPCB.

2. The FPCB connector of claim 1, wherein the FPCB connector is terminated to the first FPCB to take off at least one power and/or signal transmission from the first FPCB to the second FPCB at a midpoint of the first FPCB between a first end and a second end of the first FPCB.

3. The FPCB connector of claim 1, wherein the jumper conductors are configured to be electrically connected to traces of different layers of the first FPCB.

4. The FPCB connector of claim 1, wherein the first mating ends are separable mating ends to define a separable mating interface at the first mating interface.

5. The FPCB connector of claim 1, wherein the housing includes a flex channel configured to receive the first FPCB.

6. The FPCB connector of claim 1, wherein the housing includes alignment features configured to engage the first FPCB to locate the housing with respect to the first FPCB.

7. The FPCB connector of claim 1, wherein at least a portion of the jumper conductors are flexible.

8. The FPCB connector of claim 1, wherein the housing comprises a third mating interface configured for mating with the first FPCB opposite the first mating interface and wherein the housing comprises a fourth mating interface configured for mating with the second FPCB opposite the second mating interface.

9. The FPCB connector of claim 8, wherein the housing comprises a first flex channel configured to receive the first FPCB, the first mating interface and the third mating interface being on opposite sides of the first flex channel, and wherein the housing comprises a second flex channel configured to receive the second FPCB, the second mating interface and the fourth mating interface being on opposite sides of the second flex channel.

10. The FPCB connector of claim 1, wherein the housing comprises a first interposer defining the first mating interface and a second interposer defining the second mating interface with a jumper circuit board between the first and second interposers.

11. The FPCB connector of claim 10, wherein the first interposer comprises first interposer conductors defining segments of the jumper conductors, the second interposer comprises second interposer conductors defining segments of the jumper conductors, the jumper circuit board comprising jumper circuit board conductors routed between the first and second interposer conductors and defining segments of the jumper conductors.

12. The FPCB connector of claim 1, wherein the housing comprises a plurality of wafers stacked together, each wafer comprising a leadframe and an overmolded body overmolded over the leadframe, the overmolded bodies of the wafers defining at least a portion of the housing, each leadframe comprising a plurality of the jumper conductors held by the corresponding overmolded body.

13. The FPCB connector of claim 1, further comprising a first FPCB electrically connected to the jumper conductors at the first mating interface, the first FPCB comprising multiple layers each having a plurality of conductors, the conductors of the first FPCB being electrically connected to corresponding jumper conductors.

14. The FPCB connector of claim 13, wherein the conductors of the first FPCB include traces along the corresponding layers of the first FPCB and vias extending through the layers to a surface of the first FPCB, the jumper conductors being terminated to corresponding vias.

15. A flexible printed circuit board (FPCB) connector comprising:
- a housing holding a first interposer defining a first mating interface configured for mating with a first FPCB and holding a second interposer defining a second mating interface configured for mating with a second FPCB;
- a jumper circuit board held by the housing between the first and second interposers;
- a plurality of jumper conductors having first interposer conductors at the first mating interface being configured for mating with the first FPCB, the jumper conductors having second interposer conductors at the second mating interface being configured for mating with the second FPCB, and the jumper conductors having jumper circuit board conductors between the first and second interposer conductors;
- wherein the first mating interface is configured to be mated to the first FPCB at any location along a length of the first FPCB.

16. The FPCB connector of claim 15, wherein the jumper conductors have separable interfaces between the first interposer conductors and the jumper circuit board conductors and between the second interposer conductors and the jumper circuit board conductors.

17. The FPCB connector of claim 15, wherein the jumper circuit board conductors have segments being flexible.

18. The FPCB connector of claim 15, wherein the jumper circuit board comprises a first rigid end circuit board, a second rigid end circuit board and an intermediate flexible circuit board between the first and second rigid end circuit boards, the intermediate flexible circuit board allowing the first and second rigid end circuit boards to be variably positionable for mating with the first and second interposers and with the first and second FPCBs.

19. The FPCB connector of claim 15, wherein the first interposer comprises a flex channel configured to receive the first FPCB.

20. The FPCB connector of claim 15, further comprising a third interposer defining a third mating interface configured for mating with the first FPCB, a fourth interposer defining a fourth mating interface configured for mating with the second FPCB, and a second jumper circuit board held by the housing between the third and fourth interposers, the first and second interposers mating with upper surface of the first and second FPCBs, the third and fourth interposers mating with lower surface of the first and second FPCBs.

21. A flexible printed circuit board (FPCB) connector comprising:
- a housing having a first mating interface configured for mating with a first FPCB and a second mating interface configured for mating with a second FPCB, the housing comprising a plurality of wafers stacked together;
- each wafer comprising a leadframe and a body overmolded over the leadframe, the overmolded bodies of the wafers defining at least a portion of the housing, each leadframe comprising a plurality of jumper conductors held by the corresponding overmolded body, the jumper conductors having first mating ends at the first mating interface being configured for mating with the first FPCB and the jumper conductors having second mating ends at the second mating interface being configured for mating with the second FPCB;
- wherein the first mating interface is configured to be mated to the first FPCB at any location along a length of the first FPCB.

22. The FPCB connector of claim 21, wherein the jumper conductors are arranged at different radial levels within the overmolded body.

23. The FPCB connector of claim 21, wherein the wafers have a mounting surface configured to be mounted to the first and second FPCBs, the first and second mating ends of the jumper conductors being exposed at the mounting surface for mating to corresponding conductors of the first and second FPCBs.

24. The FPCB connector of claim 21, wherein the wafers are right-angled wafers, the overmolded bodies each having a first segment and a second segment oriented perpendicular with respect to the first segment, the jumper conductors having first segments and second segments oriented perpendicular with respect to the first segments of the jumper conductors.

25. The FPCB connector of claim 21, further comprising a second housing having a third mating interface configured for mating with the first FPCB and a fourth mating interface configured for mating with the second FPCB, the second housing comprising a plurality of wafers stacked together, each of such wafers comprising a leadframe and an overmolded body overmolded over the leadframe, such leadframes comprising a plurality of jumper conductors, the wafers of the second housing being coupled to the wafers of the other housing with the first and second FPCBs captured therebetween.

* * * * *